United States Patent
Zhao et al.

(10) Patent No.: US 12,374,853 B2
(45) Date of Patent: Jul. 29, 2025

(54) CONTROL SYSTEM FOR A PLURALITY OF DEEP ULTRAVIOLET OPTICAL OSCILLATORS

(71) Applicant: Cymer, LLC, San Diego, CA (US)

(72) Inventors: Yingbo Zhao, San Diego, CA (US); Walter Dale Gillespie, Poway, CA (US); Joshua Jon Thornes, San Diego, CA (US); Thomas Patrick Duffey, San Diego, CA (US); Eric Anders Mason, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 925 days.

(21) Appl. No.: 17/612,113

(22) PCT Filed: May 15, 2020

(86) PCT No.: PCT/US2020/033263
§ 371 (c)(1),
(2) Date: Nov. 17, 2021

(87) PCT Pub. No.: WO2020/236648
PCT Pub. Date: Nov. 26, 2020

(65) Prior Publication Data
US 2022/0255286 A1    Aug. 11, 2022

Related U.S. Application Data

(60) Provisional application No. 63/006,162, filed on Apr. 7, 2020, provisional application No. 62/851,147, filed on May 22, 2019.

(51) Int. Cl.
*H01S 3/13*  (2006.01)
*G03F 7/00*  (2006.01)
(Continued)

(52) U.S. Cl.
CPC ........ *H01S 3/1305* (2013.01); *G03F 7/70041* (2013.01); *G03F 7/7055* (2013.01);
(Continued)

(58) Field of Classification Search
CPC ........ H01S 3/1305; H01S 3/036; H01S 3/134; H01S 3/2366; H01S 3/2383;
(Continued)

(56) References Cited

U.S. PATENT DOCUMENTS 4,575,636 A * 3/1986 Caprari ................. G03F 7/2004
250/492.1
4,624,551 A * 11/1986 Anzai ................. G03F 7/70241
355/53
(Continued)

FOREIGN PATENT DOCUMENTS

CN          1886872 A      12/2006
CN        102834988 A      12/2012
(Continued)

OTHER PUBLICATIONS

Office Action, counterpart Japanese Patent Application No. 2021-563702, mailed Dec. 6, 2022, 12 pages total (including English translation of 7 pages).
(Continued)

*Primary Examiner* — David A Vanore
(74) *Attorney, Agent, or Firm* — DiBerardino McGovern IP Group LLC

(57) ABSTRACT

A deep ultraviolet (DUV) optical system includes: an optical source system including: a plurality of optical oscillators; a beam combiner; and a beam control apparatus between the optical oscillators and the beam combiner. The beam combiner is configured to receive and direct light emitted from any of the optical oscillators toward a scanner apparatus as an exposure light beam, and the beam control apparatus is
(Continued)

configured to determine whether the beam combiner receives light from a particular one of the optical oscillators. The DUV optical lithography system also includes a control system coupled to the optical source system, the control system configured to: determine whether a condition exists in the DUV optical system, and based on a determination that the condition exists, perform a calibration action in a subset of the optical oscillators.

19 Claims, 5 Drawing Sheets

(51) Int. Cl.
    *H01S 3/036*     (2006.01)
    *H01S 3/134*     (2006.01)
    *H01S 3/225*     (2006.01)
    *H01S 3/23*     (2006.01)

(52) U.S. Cl.
    CPC .............. *H01S 3/036* (2013.01); *H01S 3/134* (2013.01); *H01S 3/2366* (2013.01); *H01S 3/2383* (2013.01); *H01S 3/2251* (2013.01); *H01S 3/2253* (2013.01); *H01S 3/2256* (2013.01)

(58) Field of Classification Search
    CPC .... H01S 3/2251; H01S 3/2253; H01S 3/2256; H01S 3/23; H01S 3/131; G03F 7/70041; G03F 7/7055; G03F 7/2004
    See application file for complete search history.

(56) References Cited

U.S. PATENT DOCUMENTS

| | | | |
|---|---|---|---|
| 5,142,543 A * | 8/1992 | Wakabayashi | H01S 3/1062 372/19 |
| 6,139,166 A | 10/2000 | Marshall et al. | |
| 6,243,405 B1 * | 6/2001 | Borneis | H01S 3/225 372/60 |
| 6,278,116 B1 * | 8/2001 | Wu | G03F 7/70633 250/365 |
| 6,541,731 B2 | 4/2003 | Mead et al. | |
| 6,671,294 B2 | 12/2003 | Kroyan et al. | |
| 6,735,225 B2 | 5/2004 | Albrecht et al. | |
| 6,829,040 B1 | 12/2004 | Kye et al. | |
| 6,853,653 B2 | 2/2005 | Spangler et al. | |
| 7,002,443 B2 | 2/2006 | Ness et al. | |
| 7,039,086 B2 | 5/2006 | Fallon et al. | |
| 7,079,557 B1 | 7/2006 | Mn | |
| 7,079,564 B2 | 7/2006 | Fallon et al. | |
| 7,088,758 B2 | 8/2006 | Sandstrom et al. | |
| 7,154,928 B2 | 12/2006 | Sandstrom et al. | |
| 7,158,553 B2 | 1/2007 | Govorkov et al. | |
| 7,256,870 B2 | 8/2007 | Finders | |
| 7,286,207 B2 | 10/2007 | Nolscher et al. | |
| 7,408,714 B2 | 8/2008 | Windpassinger et al. | |
| 7,525,638 B2 | 4/2009 | Buurman et al. | |
| 7,534,552 B2 | 5/2009 | De Kruif et al. | |
| 7,612,868 B2 | 11/2009 | Tsuchiya | |
| 7,965,387 B2 | 6/2011 | Hagiwara | |
| 8,309,885 B2 | 11/2012 | Peng et al. | |
| 8,705,004 B2 | 4/2014 | Butler et al. | |
| 8,938,694 B2 | 1/2015 | Liu et al. | |
| 8,989,225 B2 | 3/2015 | Kakizaki et al. | |
| 9,207,119 B2 | 12/2015 | Rokitski et al. | |
| 9,235,136 B2 | 1/2016 | Epple | |
| 9,599,510 B2 | 3/2017 | Duffey et al. | |
| 9,625,824 B2 | 4/2017 | Lu et al. | |
| 9,835,959 B1 | 12/2017 | Conley et al. | |
| 9,939,732 B2 | 4/2018 | Aggarwal | |
| 9,989,864 B2 | 6/2018 | Baselmans et al. | |
| 9,989,866 B2 | 6/2018 | Mason et al. | |
| 10,156,782 B2 * | 12/2018 | Huber | G03F 7/70616 |
| 11,327,412 B2 | 5/2022 | Hugers et al. | |
| 2002/0006149 A1 | 1/2002 | Spangler et al. | |
| 2002/0048288 A1 | 4/2002 | Kroyan et al. | |
| 2002/0106821 A1 | 8/2002 | Bode et al. | |
| 2002/0126479 A1 | 9/2002 | Zhai et al. | |
| 2003/0016708 A1 | 1/2003 | Albrecht et al. | |
| 2003/0090643 A1 | 5/2003 | Sato | |
| 2003/0099269 A1 | 5/2003 | Ershov et al. | |
| 2003/0178583 A1 | 9/2003 | Kampherbeek et al. | |
| 2003/0219056 A1 * | 11/2003 | Yager | G03F 7/70041 372/57 |
| 2003/0219094 A1 * | 11/2003 | Basting | G03F 7/7005 378/34 |
| 2004/0057489 A1 | 3/2004 | Fallon et al. | |
| 2005/0078292 A1 | 4/2005 | Bruebach | |
| 2005/0083983 A1 | 4/2005 | Sandstrom et al. | |
| 2005/0247683 A1 | 11/2005 | Agarwal et al. | |
| 2005/0265417 A1 | 12/2005 | Fallon et al. | |
| 2006/0114957 A1 | 6/2006 | Algots | |
| 2006/0114958 A1 | 6/2006 | Trintchouk | |
| 2006/0261050 A1 | 11/2006 | Krishnan et al. | |
| 2007/0013889 A1 | 1/2007 | Jorritsma et al. | |
| 2007/0222961 A1 | 9/2007 | Schmidt | |
| 2007/0260419 A1 | 11/2007 | Hagiwara | |
| 2009/0002666 A1 | 1/2009 | Tsuchiya | |
| 2009/0219498 A1 | 9/2009 | Kono | |
| 2010/0177794 A1 | 7/2010 | Peng et al. | |
| 2012/0087386 A1 | 4/2012 | Brown et al. | |
| 2013/0279526 A1 | 10/2013 | Kakizaki et al. | |
| 2014/0028988 A1 | 1/2014 | Rafac | |
| 2014/0195993 A1 | 7/2014 | Liu et al. | |
| 2014/0236516 A1 | 8/2014 | Pforr | |
| 2015/0070673 A1 * | 3/2015 | Lalovic | G03F 7/70358 355/67 |
| 2015/0380893 A1 | 12/2015 | Matsunaga et al. | |
| 2016/0219684 A1 | 7/2016 | Kaskey et al. | |
| 2016/0320708 A1 | 11/2016 | Lu et al. | |
| 2016/0341602 A1 | 11/2016 | Thornes | |
| 2017/0063025 A1 * | 3/2017 | Wakabayashi | H01S 3/1305 |
| 2017/0123324 A1 * | 5/2017 | Mason | G03F 7/70566 |
| 2017/0160647 A1 | 6/2017 | Baselmans et al. | |
| 2017/0176879 A1 | 6/2017 | Witte et al. | |
| 2017/0187160 A1 | 6/2017 | Lowder et al. | |
| 2017/0279241 A1 | 9/2017 | Onose et al. | |
| 2017/0280545 A1 * | 9/2017 | Tomita | G01J 1/4257 |
| 2018/0107123 A1 * | 4/2018 | Mason | G03F 7/70575 |
| 2018/0109068 A1 | 4/2018 | Conley et al. | |
| 2018/0123312 A1 | 5/2018 | Furusato et al. | |
| 2018/0254600 A1 * | 9/2018 | Kumazaki | H01S 3/034 |
| 2018/0323568 A1 * | 11/2018 | Furusato | H01S 3/137 |
| 2022/0255286 A1 * | 8/2022 | Zhao | H01S 3/1305 |
| 2024/0295820 A1 * | 9/2024 | Shih | G03F 7/11 |

FOREIGN PATENT DOCUMENTS

| | | |
|---|---|---|
| CN | 108341461 A | 7/2018 |
| CN | 108351058 A | 7/2018 |
| CN | 108449957 A | 8/2018 |
| CN | 108474651 A | 8/2018 |
| CN | 109613802 A | 4/2019 |
| DE | 1020122181051 A1 | 8/2019 |
| JP | H11307421 A | 11/1999 |
| JP | 2003031881 A | 1/2003 |
| JP | 2005142306 A | 6/2005 |
| JP | 4577064 B2 | 11/2010 |
| JP | 4580246 B2 | 11/2010 |
| JP | 2012174883 A | 10/2012 |
| JP | 2019003202 A | 1/2019 |
| JP | 2022533942 A | 7/2022 |
| KR | 20060125905 A | 6/2006 |
| TW | 492234 B | 6/2002 |
| TW | 200512546 A | 4/2005 |
| TW | 200601732 A | 1/2006 |
| TW | 200737625 A | 10/2007 |
| TW | 201706579 A | 2/2017 |
| TW | 201725355 A | 7/2017 |
| WO | 9812500 A1 | 3/1998 |
| WO | 2003096492 A2 | 11/2003 |

(56) References Cited

FOREIGN PATENT DOCUMENTS

| WO | 2005054949 A2 | 6/2005 |
|---|---|---|
| WO | 2005089131 A2 | 9/2005 |
| WO | 2008052153 A2 | 5/2008 |
| WO | 2009018664 A2 | 2/2009 |
| WO | 2011126992 A1 | 10/2011 |
| WO | 2016209669 A1 | 12/2016 |
| WO | 2017026000 A1 | 2/2017 |
| WO | 2017040431 A1 | 3/2017 |
| WO | 2017050506 A1 | 3/2017 |
| WO | 2017098625 A1 | 6/2017 |
| WO | 2019079010 A1 | 4/2019 |
| WO | 2019174885 A1 | 9/2019 |
| WO | 2019190700 A1 | 10/2019 |
| WO | 2020236130 A1 | 11/2020 |

OTHER PUBLICATIONS

Wang Hailong et al., "Experimental Study of Near-Infrared to Mid-Infrared Laser Output Based on Single Resonant Optical Parametric Oscillator", Chinese Journal of Lasers, 49(18): 1801005 Published Sep. 25, 2022, 9 total pages.
Office Action, counterpart Korean Patent Application No. 10-2021-7037816, mailed Jan. 27, 2023, 12 pages total (including English translation of 5 pages).
Patrik Flierl, European International Searching Authority, International Search Report and Written Opinion, counterpart PCT Application No. PCT/US2020/033263, mailed Aug. 20, 2020, 9 pages total.

\* cited by examiner

CONTROL SYSTEM FOR A PLURALITY OF DEEP ULTRAVIOLET OPTICAL OSCILLATORS

CROSS REFERENCE TO RELATED APPLICATIONS

This application claims priority to U.S. Application No. 62/851,147, filed May 22, 2019 and titled CONTROL SYSTEM FOR A PLURALITY OF DEEP ULTRAVIOLET OPTICAL OSCILLATORS, and U.S. Application No. 63/006,162, filed Apr. 7, 2020 and titled CONTROL SYSTEM FOR A PLURALITY OF DEEP ULTRAVIOLET OPTICAL OSCILLATORS, both of which are incorporated herein in their entireties by reference.

TECHNICAL FIELD

This disclosure relates to a control system for a plurality of deep ultraviolet (DUV) optical oscillators.

BACKGROUND

Photolithography is the process by which semiconductor circuitry is patterned on a substrate such as a silicon wafer. An optical source generates deep ultraviolet (DUV) light used to expose a photoresist on the wafer. DUV light may include wavelengths from, for example, about 100 nanometers (nm) to about 400 nm. Often, the optical source is a laser source (for example, an excimer laser) and the DUV light is a pulsed laser beam. The DUV light from the optical source interacts with a projection optical system, which projects the beam through a mask onto the photoresist on the silicon wafer. In this way, a layer of chip design is patterned onto the photoresist. The photoresist and wafer are subsequently etched and cleaned, and then the photolithography process repeats.

SUMMARY

In one aspect, a deep ultraviolet (DUV) optical system includes: an optical source system including: a plurality of optical oscillators; a beam combiner; and a beam control apparatus between the optical oscillators and the beam combiner. The beam combiner is configured to receive and direct light emitted from any of the optical oscillators toward a scanner apparatus as an exposure light beam, and the beam control apparatus is configured to determine whether the beam combiner receives light from a particular one of the optical oscillators. The DUV optical lithography system also includes a control system coupled to the optical source system, the control system configured to: determine whether a condition exists in the DUV optical system, and based on a determination that the condition exists, perform a calibration action in a subset of the optical oscillators.

Implementations may include one or more of the following features.

The calibration action may include bringing a wavelength of light produced by at least one of the optical oscillators to be within a target range.

The calibration action may include bringing a bandwidth of light produced by at least one of the optical oscillators to be within a target range.

The calibration action may include bringing a pulse energy of light produced by at least one of the optical oscillators to be within a target range.

The condition may be a time-based condition or an event-based condition. The condition may be an event-based condition, the control system may be coupled to the light source system and the scanner apparatus, the control system may be configured to receive a status signal from the DUV optical system, and the control system may determine whether the event-based condition exists based on the status signal from the scanner apparatus. The status signal may include information related to an upcoming event in the scanner apparatus, and the control system may perform the calibration action based on the information related to the upcoming event. The information related to the upcoming event may include an amount of time until the upcoming event occurs and an indication that identifies the upcoming event, and the control system may perform the calibration action before the upcoming event occurs. The upcoming event may include a change in an operating condition of the scanner apparatus, the change in the operating condition may include a change in a repetition rate of the exposure beam, a change in a power of the exposure beam, or a change in operating mode of the scanner apparatus. The calibration action performed may be one of a plurality of available calibration actions, and the calibration action performed may be determined from the plurality of available calibration actions based on the indication that identifies the upcoming event.

The condition may be a time-based condition, the control system may be configured to monitor a status of the DUV optical system, and the control system may be configured to determine the condition of the DUV optical system based on the monitored status of the optical source system. The control system being configured to monitor the status of the DUV optical system may include the control system being configured to monitor an amount of time that has passed since a starting time, and the control system may determine the condition of the DUV optical system based on the amount of time that has passed since the starting time. The starting time may include a time at which an immediately preceding calibration event occurred. In some implementations, to determine the condition of the DUV optical system, the control system is further configured to compare the amount of time that has passed to a specification, and the control system is configured to perform the calibration action if the amount of time that has passed meets the specification.

Each optical oscillator may include a gain medium, the gain medium may include a gaseous gain medium, and the calibration action may include a refill operation. In these implementations, the refill operation includes exchanging the gaseous gain medium in a subset of the optical oscillators.

The beam control apparatus may include a beam blocking device for each of the plurality of optical oscillators, and each of the beam blocking devices may be coupled to the control system; and the control system may be further configured to control the beam blocking devices to determine whether the beam combiner receives light from a particular one of the optical oscillators. Each beam blocking device may include a shutter that has a first state that transmits DUV light and a second state that blocks DUV light, and each shutter may be configured for placement at the output of one of the optical oscillators such that each shutter prevents a respective one of the optical oscillators from emitting light toward the beam combiner when in the second state and allows the respective one of the optical oscillators to emit light toward the beam combiner when in the first state.

In some implementations, the subset of the optical oscillators does not include any of the plurality of optical oscillators that are producing a light beam that is part of the exposure beam.

In some implementations, the calibration action is only performed if the beam combiner does not receive light from the subset of the optical oscillators.

In some implementations, the DUV optical system is configured for use in a DUV optical lithography system. Moreover, the DUV optical system may include a scanner apparatus configured to receive an exposure beam from the beam combiner.

In another aspect, a method of controlling a plurality of optical oscillators in a deep ultraviolet (DUV) optical system includes: monitoring the DUV optical system to determine if a condition exists; if a condition exists, determining if any of the plurality of optical oscillators are in a waiting state; and performing a calibration action in a subset of the plurality of optical oscillators that are in the waiting state. One or more of the optical oscillators that are not in the waiting state continue to produce an exposure beam while the calibration action is performed.

Implementations may include one or more of the following features. The method also may include determining whether the calibration action was successful.

The DUV optical system may be configured for use with a DUV optical lithography system, and monitoring the DUV optical system may include receiving a command signal from a scanner apparatus and determining whether the condition exists based on the command signal.

In some implementations, if the condition exists and none of the plurality of optical oscillators are in the waiting state, at least one optical oscillator is placed in the waiting state.

In another aspect, an optical lithography system includes: a deep ultraviolet (DUV) optical lithography system including: an optical source system including: a plurality of optical oscillators, each including a gain medium; a beam combiner; and a beam control apparatus between the gain media and the beam combiner. The beam combiner is configured to receive and direct light emitted from any of the optical oscillators toward a scanner apparatus as an exposure light beam, and the beam control apparatus is configured to determine whether the beam combiner receives light from a particular one of the optical oscillators. The DUV optical lithography system also includes: a scanner apparatus; and a control system coupled to the optical source system and the scanner apparatus, the control system configured to: determine whether a condition exists in the optical lithography system, and if a condition is determined to exist, perform a calibration action in a subset of the optical oscillators.

Implementations may include one or more of the following features. The optical lithography system also may include a gas supply system fluidly coupled to the plurality of optical oscillators.

In another aspect, a method of controlling a plurality of optical oscillators in a deep ultraviolet (DUV) optical lithography system includes: receiving a request for an exposure beam configured to provide a requested close of DUV light to a wafer; determining if a cold start condition exists; and if the cold start condition exists: activating more than a nominal number of optical oscillators, the nominal number of optical oscillators being a number of optical oscillators capable of providing the requested dose under steady-state conditions; and directing a light beam from each of the activated optical oscillators toward a scanner apparatus to provide the exposure beam during a cold start period.

In some implementations, if the cold start condition exists, the method also includes:
determining whether the cold start period has ended; and if the cold start period has ended, deactivating at least one of the activated optical oscillators.

In another aspect, a control system includes: an interface configured to communicate with a DUV optical system. The control system is configured to control the DUV optical system by:
determining whether a condition exists in the DUV optical system, and based on a determination that the condition exists, performing a calibration action in a subset of optical oscillators in the DUV optical system while at least one optical oscillator that is not in the subset of optical oscillators produces an exposure beam.

In some implementations, the control system also includes: one or more electronic processors; and a computer-readable electronic storage coupled to the one or more electronic processors, the computer-readable electronic storage including executable instructions that, when executed, cause the control system to communicate with the DUV optical system via the interface.

Implementations of any of the techniques described above and herein may include a process, an apparatus, a control system, instructions stored on a non-transient machine-readable computer medium, and/or a method. The details of one or more implementations are set forth in the accompanying drawings and the description below. Other features will be apparent from the description and drawings, and from the claims.

DETAILED DESCRIPTION

Figure 1:
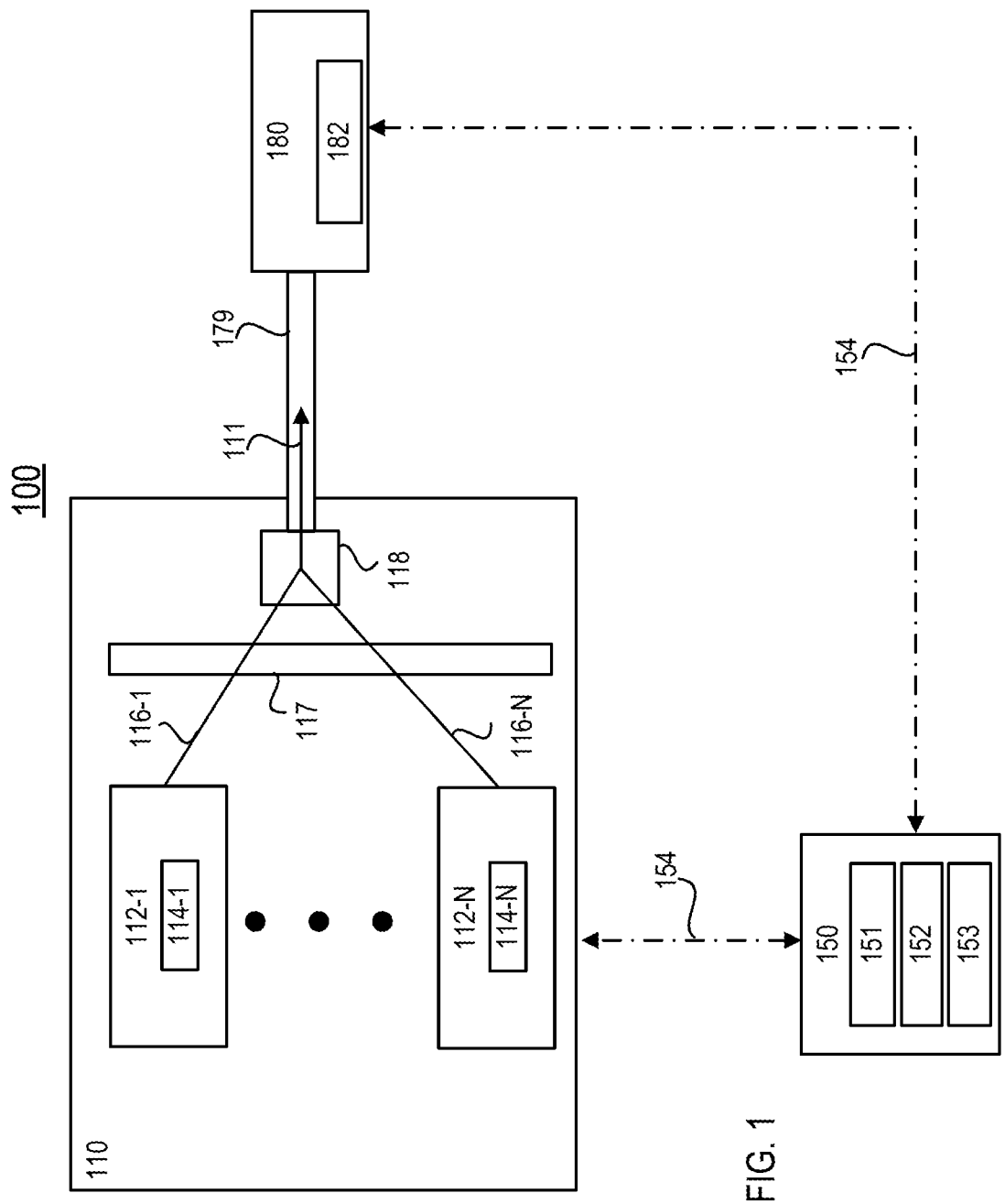
FIG. 1 is a block diagram of an example of an optical lithography system.

Referring to FIG. 1, a block diagram of an optical lithography system 100 is shown. The optical lithography system 100 includes an optical source system 110, which produces an exposure beam 111 that is provided to a scanner apparatus 180. The scanner apparatus 180 exposes a wafer 182 with the exposure beam 111.

The optical source system 110 includes N optical oscillators 112-1 to 112-N, where N is an integer number that is greater than one. Each optical oscillator 112-1 to 112-N includes a respective gaseous gain medium 114-1 to 114-N that produces a respective light beam 116-1 to 116-N. The optical source system 110 also includes a beam combiner 118 that directs incident light onto a beam path 179 to form the exposure beam 111. The beam path 179 is between the beam combiner 118 and the scanner apparatus 180. The beam combiner 118 is any optical element capable of directing the light beams 116-1 to 116-N onto the beam path 179. For example, the beam combiner 118 may be a collection of refractive and/or reflective optical elements.

The beam combiner 118 is positioned to receive all of the light beams 116-1 to 116-N. However, the light incident on the beam combiner 118 (and included in the exposure beam 111) may include one of the light beams 116-1 to 116-N, all of the light beams 116-1 to 116-N, or any combination of the various light beams 116-1 to 116-N. Moreover, the particular one or ones of the light beams 116-1 to 116-N incident on the beam combiner 118 (and included in the exposure beam 111) may change during operation of the optical lithography system 100. For example, in some applications, the dose delivered by a single one of the light beams 116-1 to 116-N is sufficient to expose the wafer 182. The dose is an amount of optical energy delivered to an area. In these applications, the configuration of the optical source system 110 is such that only one of the light beams 116-1 to 116-N is permitted to reach the beam combiner 118. In other applications, the dose delivered by a single one of the light beams 116-1 to 116-N is not sufficient to expose the wafer 182. In these applications, more than one of the light beams 116-1 to 116-N reach the beam combiner 118 and contribute to the exposure beam 111.

Figure 3:
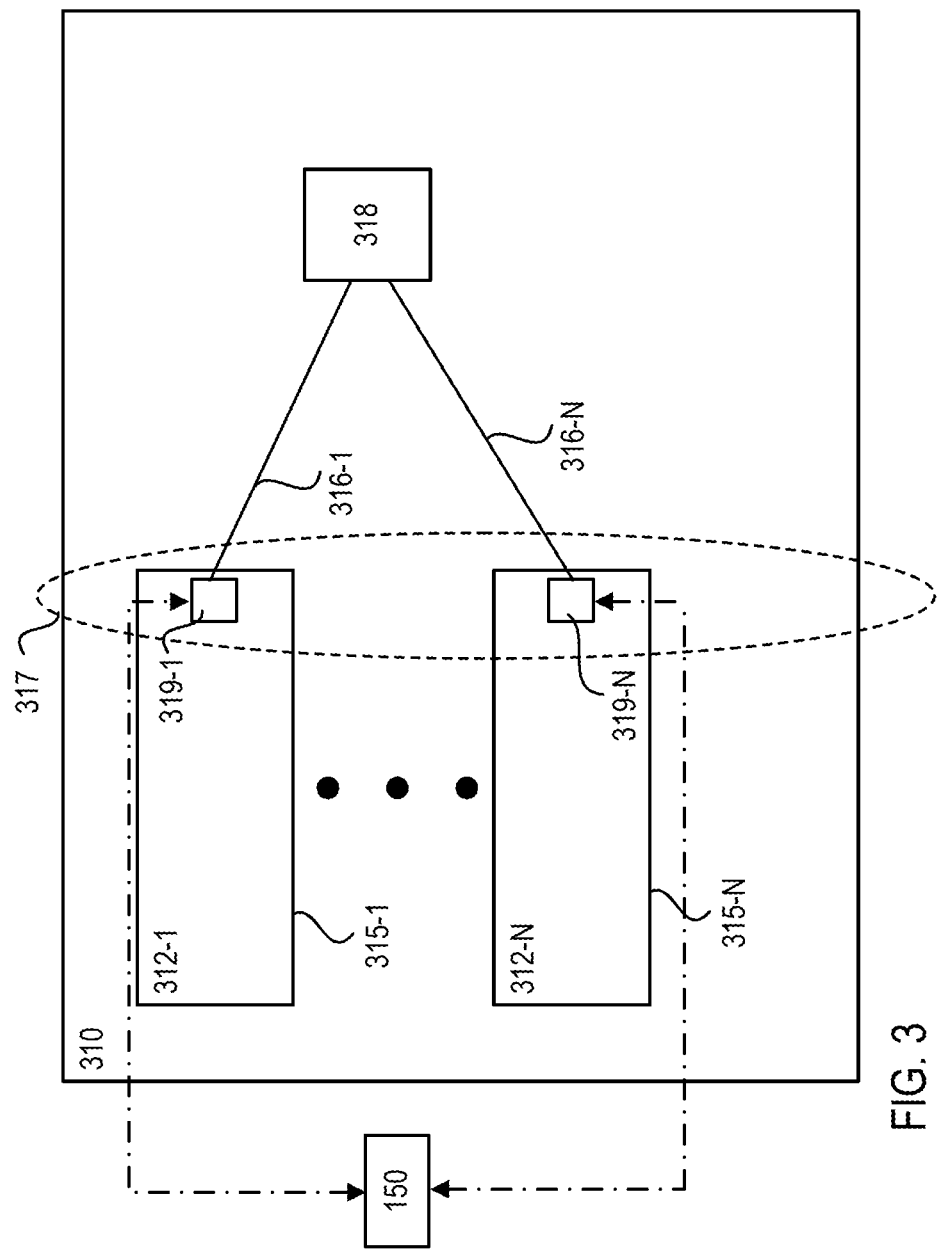
FIG. 3 is a block diagram of an example of an optical source system.

The optical oscillators 112-1 to 112-N are independent of each other, and the control system 150 determines which of the light beams 116-1 to 116-N are incident on the beam combiner 118. The particular one or ones of the light beams 116-1 to 116-N that are incident on the beam combiner 118 is determined, for example, by controlling the optical source system 110, the optical oscillators 112-1 to 112-N, and/or components of the optical source system 110. For example, the configuration of a beam control apparatus 117 (which is between the gain media 114-1 to 114-N and the beam combiner 118) may be controlled to determine which of the light beams 1164 to 116-N reach the beam combiner 118. In some implementations, the beam control apparatus 117 includes a shutter for each optical oscillator 112-1 to 112-N. Each shutter is controlled by the control system 150 to determine whether the respective light beam 116-1 to 116-N is blocked or is incident on the beam combiner 118. FIG. 3 shows an example of the beam control apparatus 117 implemented as N shutters.

The control system 150 causes a calibration action to occur in one or more optical oscillators 112-1 to 112-N that are not contributing to the exposure beam 111. In this way, the control system 150 leverages the independent nature of the optical oscillators 112-1 to 112-N to perform calibration actions while the exposure beam 111 is being produced. The control system 150 monitors the optical lithography system 100 to determine whether a condition exists in the optical lithography system 100. If a condition exists, the control system 150 performs a calibration action. The control system 150 causes calibration actions to be performed only in a subset of the optical oscillators 112-1 to 112-N that are associated with light beams 116-1 to 116-N that are not incident on the beam combiner 118. For example, if the light beam 116-1 is not incident on the beam combiner 118, and all of the other N−1 light beams are incident on the beam combiner 118, the control system 150 may initiate a calibration action in the optical oscillator 112-1, and not in the other N−1 optical oscillators.

Thus, the exposure beam 111 continues to be produced and the wafer 182 continues to be exposed while the calibration action is performed in the optical oscillator 112-1. This allows calibration actions that traditionally would have required that the entire optical lithography system 100 be taken offline to be performed while the exposure beam 111 is produced. The control system 150 improves the performance of the optical lithography system 100 by reducing the amount of downtime and enables the exposure beam 111 to be produced more consistently and over longer periods of time. Furthermore, because the optical lithography system 100 does not have to be taken offline to perform the calibration action, the calibration action may be performed more often and more easily. By performing the calibration action more often, the lifetime of the optical oscillators 112-1 to 112-N may be extended.

The control system 150 may monitor for one or more of a variety of conditions. The optical lithography system 100 does not necessarily include the scanner apparatus 180. Thus, the condition in the optical lithography system 100 may be a condition in one or more of the optical oscillators 112-1 to 112-N and/or a condition in the scanner apparatus 180. The condition may be a time-based condition or an event-based condition. A time-based condition is a condition that exists when a pre-defined amount of time has passed. For example, the control system 150 may determine that a time-based condition exists in one of the optical oscillators 112-1 to 112-N when a pre-defined amount of time has passed since the most recent calibration action was performed in that optical oscillator. In another example, a time-based condition may be a condition that occurs based on a pre-determined schedule. For example, a calibration action may be scheduled to be performed every time a certain amount of time passes. An event-based condition is a condition that exists when an event occurs. Examples of event-based conditions include receipt of a command from the scanner apparatus 180 and/or receipt of a command from one or more of the optical oscillators 112-1 to 112-N. Event-based conditions may have aspects of time. For example, an event-based condition may exist after a certain number of pulses have been produced by any of the optical oscillators 112-1 to 112-N at a particular repetition rate.

The calibration action is any type of procedure that calibrates or otherwise readies or enhances the performance of the optical oscillators 112-1 to 112-N. The calibration action may be, for example, a procedure to bring one or more parameters (such as energy, a bandwidth, and/or a center wavelength) into a specified or target range. In another example, the calibration action is a refill procedure that includes removing and replacing one or more of the gaseous gain media 114-1 to 114-N. In yet another example, the calibration action is a warm up procedure that prepares one or more of the optical oscillators 112-1 to 112-N for steady-state operation. An in-production calibration technique that includes performing one or more calibration actions is discussed with respect to FIG. 4.

In some implementations, the control system 150 is configured to produce the exposure beam 111 during a cold start period by activating more than a nominal number of the optical oscillators 112-1 to 112-N. The nominal number of optical oscillators is the number of the optical oscillators 112-1 to 112-N that are activated to produce the exposure beam 111 under ordinary steady-state conditions. By activating more than the nominal number of optical oscillators 112-1 to 112-N, the control system 150 compensates for energy inefficiencies that may be present during the cold start period. The production of the exposure beam during the cold start period is discussed in more detail with respect to FIG. 5.

The control system 150 includes an electronic processing module 151, an electronic storage 152, and an I/O interface 153. The electronic processing module 151 includes one or more processors suitable for the execution of a computer program such as a general or special purpose microprocessor, and any one or more processors of any kind of digital computer. Generally, an electronic processor receives instructions and data from a read-only memory, a random access memory (RAM), or both. The electronic processing module 151 may include any type of electronic processor. The electronic processor or processors of the electronic processing module 151 execute instructions and access data stored on the electronic storage 152. The electronic processor or processors are also capable of writing data to the electronic storage 152.

The electronic storage 152 may be volatile memory, such as RAM, or non-volatile memory. In some implementations, and the electronic storage 152 includes non-volatile and volatile portions or components. The electronic storage 152 may store data and information that is used in the operation of the control system 150. For example, the electronic storage 152 may store specification information for the optical oscillators 112-1 to 112-N. The specification information may include, for example, target energy, wavelength, bandwidth, and/or beam quality ranges for various operating modes of the optical lithography system 100 and the scanner apparatus 180. The electronic storage 152 also may store instructions (for example, in the form of a computer program) that are associated with specific calibration actions.

The electronic storage 152 also may store instructions (for example, in the form of a computer program) that cause the control system 150 to interact with other components and subsystems in the optical lithography system 100 to perform a calibration action. For example, the instructions may be instructions that cause the electronic processing module 151 to provide a command signal to the optical source system 110 such that a calibration action is performed in one or more of the optical oscillators 112-1 to 112-N. The electronic storage 152 also may store information received from the optical lithography system 100, the scanner apparatus 180, and/or the optical source system 110.

The I/O interface 153 is any kind of interface that allows the control system 150 to exchange data and signals with an operator, the optical source system 110, the scanner apparatus 180, and/or an automated process running on another electronic device. For example, in implementations in which rules or instructions stored on the electronic storage 152 may be edited, the edits may be made through the I/O interface 153. The I/O interface 153 may include one or more of a visual display, a keyboard, and a communications interface, such as a parallel port, a Universal Serial Bus (USB) connection, and/or any type of network interface, such as, for example, Ethernet. The I/O interface 153 also may allow communication without physical contact through, for example, an IEEE 802.11, Bluetooth, or a near-field communication (NFC) connection.

The control system 150 is coupled to the optical source system 110 and/or the scanner apparatus 180 through a data connection 154. The data connection 154 may be a physical cable or other physical data conduit (such as a cable that supports transmission of data based IEEE 802.3), a wireless data connection (such as a data connection that provides data via IEEE 802.11 or Bluetooth), or a combination of wired and wireless data connections. The data that is provided over the data connection may be set through any type of protocol or format. The data connection 154 is connected to the optical source system 110 and/or the scanner apparatus 180 at respective communication interfaces (not shown). The communication interfaces may be any kind of interface capable of sending and receiving data. For example, the data interfaces may be an Ethernet interface, a serial port, a parallel port, or a USB connection. In some implementations, the data interfaces allow data communication through a wireless data connection. For example, the data interfaces may be an IEEE 811.11 transceiver, Bluetooth, or an NFC connection. The control system 150 may be connected to systems and/or components within the optical source system 110 and/or the scanner apparatus 180. For example, the control system 150 may be directly connected to each of the optical oscillators 112-1 to 112-N.

Figure 2:
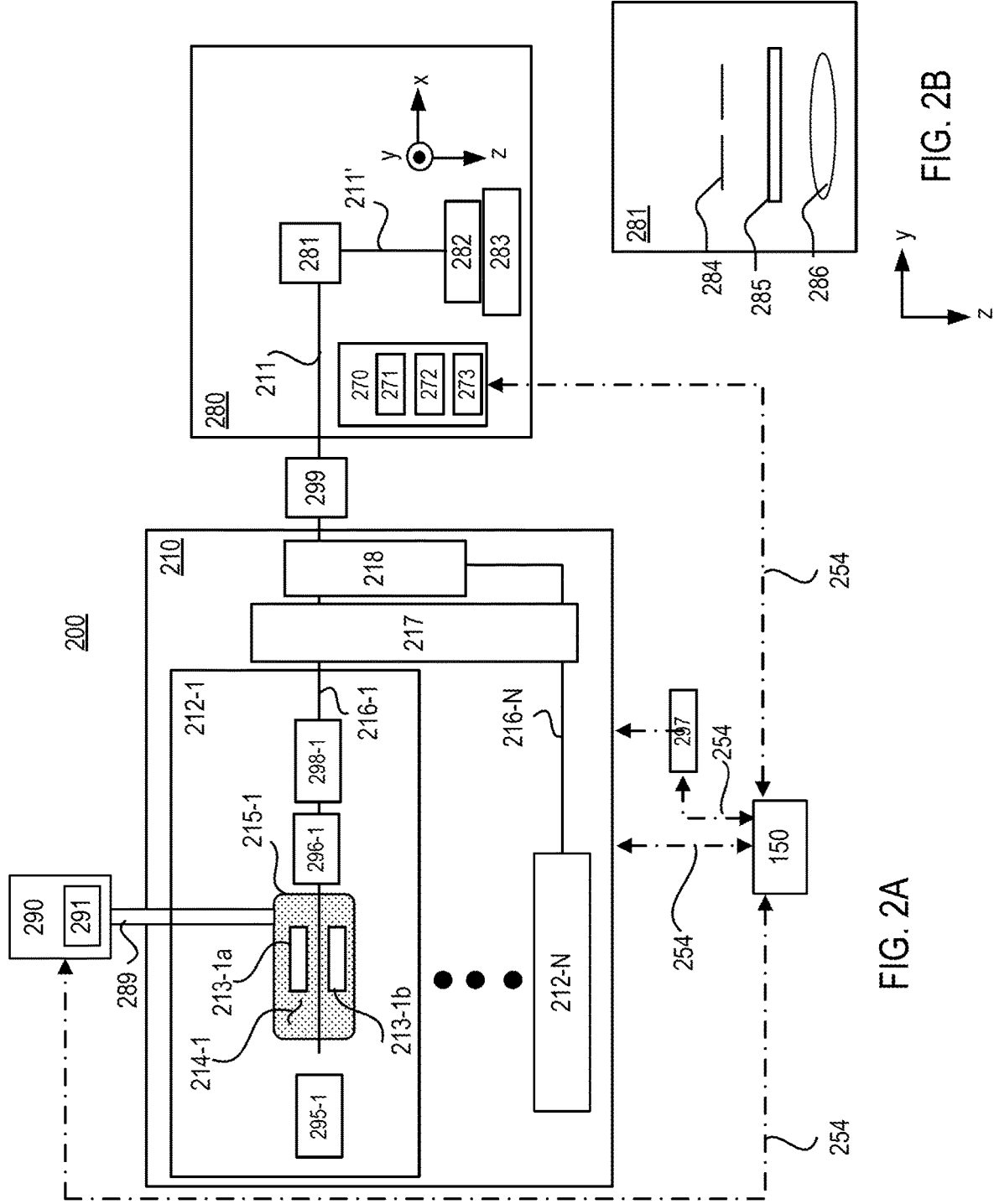
FIG. 2A is a block diagram of another example of an optical lithography system.
FIG. 2B is a block diagram of an example of a projection optical system used in the optical lithography system of FIG. 2A.

Referring to FIGS. 2A and 2B, an optical lithography system 200 includes an optical source system 210 that provides an exposure beam 211 to a scanner apparatus 280. The optical source system 210 is an example implementation of the optical source system 110 (FIG. 1). The scanner apparatus 280 is an example implementation of the scanner apparatus 180 (FIG. 1). The scanner apparatus 280 exposes a wafer 282 with a shaped exposure beam 211'. The shaped exposure beam 211' is formed by passing the exposure beam 211 through a projection optical system 281.

The optical source system 210 includes optical oscillators 212-1 to 212-N, where N is an integer number that is greater than one. Each optical oscillator 210-1 to 210-N generates a respective light beam 216-1 to 216-N. The details of the optical oscillator 212-1 are discussed below. The other N−1 optical oscillators in the optical source system 210 include the same or similar features.

The optical oscillator 212-1 includes a discharge chamber 215-1, which encloses a cathode 213-1$a$ and an anode 213-1$b$. The discharge chamber 215-1 also contains a gaseous gain medium 214-1. A potential difference between the cathode 213-1$a$ and the anode 213-1$b$ forms an electric field in the gaseous gain medium 214-1. The potential difference may be generated by controlling a voltage source 297 coupled to the control system 150 to apply a voltage to the cathode 213-1$a$ and/or the anode 213-1$b$. The electric field provides energy to the gain medium 214-1 sufficient to cause a population inversion and to enable generation of a pulse of light via stimulated emission. Repeated creation of such a potential difference forms a train of pulses of light to make the light beam 216-1. The repetition rate of the pulsed light beam 216-1 is determined by the rate at which voltage is applied to the electrodes 213-1$a$, 213-1$b$. The duration of the pulses in the pulsed light beam 216-1 is determined by the duration of the application of the voltage to the electrodes 2131$a$ and 2131$b$. The repetition rate of the pulses may range, for example, between about 500 and 6,000 Hz. In some implementations, the repetition rate may be greater than 6,000 Hz, and may be, for example, 12,000 Hz or greater. Each pulse emitted from the optical oscillator 212-1 may have a pulse energy of, for example, approximately 1 milliJoule (mJ).

The gaseous gain medium 214-1 may be any gas suitable for producing a light beam at the wavelength, energy, and bandwidth required for the application. For an excimer source, the gaseous gain medium 214-1 may contain a noble gas (rare gas) such as, for example, argon or krypton, a halogen, such as, for example, fluorine or chlorine and traces of xenon apart from a buffer gas, such as helium. Specific examples of the gaseous gain medium 214-1 include argon fluoride (ArF), which emits light at a wavelength of about 193 nm, krypton fluoride (KrF), which emits light at a wavelength of about 248 nm, or xenon chloride (XeCl), which emits light at a wavelength of about 351 mm. The gain medium 214-1 is pumped with short (for example, nanosecond) current pulses in a high-voltage electric discharge by application of a voltage to the electrodes 213-1*a*, 213-1*b*.

A resonator is formed between a line narrowing module 295-1 on one side of the discharge chamber 215-1 and an output coupler 296-1 on a second side of the discharge chamber 215-1. The line narrowing module 2951 may include a diffractive optic such as, for example, a grating and/or a prism, that finely tunes the spectral output of the discharge chamber 215-1. In some implementations, the line narrowing module 295-1 includes a plurality of diffractive optical elements. For example, the line narrowing module 295-1 may include four prisms, some of which are configured to control a center wavelength of the light beam 216-1 and others of which are configured to control a spectral bandwidth of the light beam 216-1.

The optical oscillator 212-1 also includes a line center analysis module 298-1 that receives an output light beam from the output coupler 296-1. The line center analysis module 298-1 is a measurement system that may be used to measure or monitor the wavelength of the light beam 216-1. The line center analysis module 298-1 may provide data to the control system 150, and the control system 150 may determine metrics related to the light beam 216-1 based on the data from the line center analysis module 298-1. For example, the control system 150 may determine a beam quality metric or a spectral bandwidth based on the data measured by the line center analysis module 298-1.

The optical source system 210 also includes gas supply system 290 that is fluidly coupled to an interior of the discharge chamber 215-1 via a fluid conduit 289. The fluid conduit 289 is any conduit that is capable of transporting a gas or other fluid with no or minimal loss of the fluid. For example, the fluid conduit 289 may be a pipe that is made of or coated with a material that does not react with the fluid or fluids transported in the conduit 289. The gas supply system 290 includes a chamber 291 that contains and/or is configured to receive a supply of the gas or gasses used in the gain medium 214-1. The gas supply system 290 also includes devices (such as pumps, valves, and/or fluid switches) that enable the gas supply system 290 to remove gas from or inject gas into the discharge chamber 215-1. The gas supply system 290 is coupled to the control system 150. The gas supply system 290 may be controlled by the control system 150 to perform, for example, a refill procedure.

The other N−1 optical oscillators are similar to the optical oscillator 212-1 and have similar or the same components and subsystems. For example, each of the optical oscillators 212-1 to 212-N includes electrodes similar to the electrodes 213-1*a*, 213-1*b*, a line narrowing module similar to the line narrowing module 295-1, and an output coupler similar to the output coupler 296-1. The optical oscillators 212-1 to 212-N may be tuned or configured such that all of the light beams 216-1 to 216-N have the same properties or the optical oscillators 212-1 to 212-N may be tuned or configured such that at least some optical oscillators have at least some properties that are different from other optical oscillators. For example, all of the light beams 216-1 to 216-N may have the same center wavelength, or the center wavelength of each light beam 216-1 to 216-N may be different. The center wavelength produced by a particular one of the optical oscillators 212-1 to 212-N may be set using the respective line narrowing module.

Moreover, the voltage source 297 may be electrically connected to the electrodes in each optical oscillator 212-1 to 212-N, or the voltage source 297 may be implemented as a voltage system that includes N individual voltage sources, each of which is electrically connected to the electrodes of one of the optical oscillators 212-1 to 212-N.

The optical source system 210 also includes a beam control apparatus 217 and a beam combiner 218. The beam control apparatus 217 is between the gaseous gain media of the optical oscillators 212-1 to 212-N and the beam combiner 218. The beam control apparatus 217 determines which of the light beams 216-1 to 216-N are incident on the beam combiner 218. The beam combiner 218 forms the exposure beam 211 from the light beam or light beams that are incident on the beam combiner 218. In the example shown, the beam control apparatus 217 is represented as a single element. However, the beam control apparatus 217 may be implemented as a collection of individual beam control apparatuses. For example, the beam control apparatus 217 may include a collection of shutters, with one shutter being associated with each optical oscillator 212-1 to 212-N.

The optical source system 210 may include other components and systems. For example, the optical source system 210 may include a beam preparation system 299 that includes a bandwidth analysis module that measures various properties (such as the bandwidth or the wavelength) of a light beam. The beam preparation system also may include a pulse stretcher (not shown) that stretches each pulse that interacts with the pulse stretcher in time. The beam preparation system also may include other components that are able to act upon light such as, for example, reflective and/or refractive optical elements (such as, for example, lenses and mirrors), and/or filters. In the example shown, the beam preparation system 299 is positioned in the path of the exposure beam 211. However, the beam preparation system 299 may be placed at other locations within the optical lithography system 200. Moreover, other implementations are possible. For example, the optical source system 210 may include N instances of the beam preparation system 299, each of which is placed to interact with one of the light beams 216-1 to 216-N. In another example, the optical source system 210 may include optical elements (such as mirrors) that steer the light beams 216-1 to 216-N toward the beam combiner 218.

The scanner apparatus 280 may be a liquid immersion system or a dry system. The scanner apparatus 280 includes a projection optical system 281 through which the exposure beam 211 passes prior to reaching the wafer 282, and a sensor system or metrology system 270. The wafer 282 is held or received on a wafer holder 283. Referring also to FIG. 2B, the projection optical system 281 includes a slit 284, a mask 285, and a projection objective, which includes a lens system 286. The lens system 286 includes one or more optical elements. The exposure beam 211 enters the scanner apparatus 280 and impinges on the slit 284, and at least some of the beam 211 passes through the slit 284 to form the shaped exposure beam 211'. In the example of FIGS. 2A and 2B, the slit 284 is rectangular and shapes the exposure beam 211 into an elongated rectangular shaped light beam, which is the shaped exposure beam 211'. The mask 285 includes a pattern that determines which portions of the shaped light beam are transmitted by the mask 285 and which are blocked by the mask 285. Microelectronic features are formed on the wafer 282 by exposing a layer of radiation-sensitive photoresist material on the wafer 282 with the exposure beam 211'. The design of the pattern on the mask is determined by the specific microelectronic circuit features that are desired.

The metrology system 270 includes a sensor 271. The sensor 271 may be configured to measure a property of the shaped exposure beam 211' such as, for example, bandwidth, energy, pulse duration, and/or wavelength. The sensor 271 may be, for example, a camera or other device that is able to capture an image of the shaped exposure beam 211' at the wafer 282, or an energy detector that is able to capture data that describes the amount of optical energy at the wafer 282 in the x-y plane.

The metrology system 270 also includes an electronic processing module 272 and an electronic storage 273. The electronic processing module 272 is similar to the electronic processing module 151, and the electronic storage 273 is similar to the electronic storage 152 (FIG. 1). The electronic storage 273 may store, for example, information that causes the electronic processing module 272 to generate a command signal or trigger signal that is provided to the control system 150 via a data connection 254. The trigger signal causes the control system 150 to initiate a calibration action in one or more of the optical oscillators 212-1 to 212-N, as discussed with respect to FIG. 4. The command signal generated by the metrology system 270 may be based on, for example, a time-based rule and/or the occurrence of an event. For example, the metrology system 270 may generate the command signal and provide it to the control system 150 on a periodic basis or every time a certain amount of time passes. The command signal may be generated based on an event. For example, the command signal may be generated if the close determined based on data from the sensor 271 is outside of the specification for the current application. In this example, the command signal includes information that causes the control system 150 to perform a calibration action that corrects the pulse energy of one of more of the light beams 216-1 to 216-N.

The scanner apparatus 280 also may include, for example, temperature control devices (such as air conditioning devices and/or heating devices), and/or power supplies for the various electrical components.

Referring to FIG. 3, an optical source system 310 is shown. The optical source system 310 is another example of an implementation of the optical source system 110. The optical source system 310 includes optical oscillators 312-1 to 312-N, where N is an integer number that is greater than one. Each optical oscillator 312-1 to 312-N includes a discharge chamber 315-1 to 315-N and produces a respective light beam 316-1 to 316-N.

The optical source system 310 includes a beam control apparatus 317 between the optical oscillators 312-1 to 312-N and a beam combiner 318. The beam control apparatus 317 includes N shutters 319-1 to 319-N. In the example of FIG. 3, each shutter 319-1 to 319-N is within the respective discharge chamber 315-1 to 315-N. However, in other implementation, each shutter 319-1 to 319-N is outside of the respective discharge chamber 315-1 to 315-N.

Each shutter 319-1 to 319-N has at least two stable states, including a first state in which the shutter 319-1 to 319-N transmits the respective light beam 316-1 to 316-N and a second state in which the shutter 319-1 to 319-N blocks the respective light beam 316-1 to 316-N. Each shutter 319-1 to 319-N is coupled to the control system 150. The beam control apparatus 317 and/or the shutters 319-1 to 319-N may send information to the control system 150 and may receive information from the control system 150. For example, the beam control apparatus 317 may send information about the state of the shutters to the control system 150, and the shutters 319-1 to 319-N may change state in response to receipt of a command signal from the control system 150.

The beam control apparatus 317 may be mechanical or electro-optical. In implementations in which the beam control apparatus 317 is mechanical, each shutter 319-1 to 319-N is made of a material that is opaque to the wavelengths of light produced by the respective optical oscillator 312-1 to 312-N. The mechanical shutter is configured to move in and out of the path of the respective light beam 316-1 to 316-N. When the mechanical shutter 319-1 to 319-N is in the path of the respective light beam 316-1 to 316-N, that light beam is blocked. When the mechanical shutter 319-1 to 319-N is not in the path of the respective light beam 316-1 to 316-N, that light beam is not blocked and is incident on the beam combiner 318. The beam control apparatus 317 also includes various associated components for operating the mechanical shutters 319-1 to 319-N. For example, the beam control apparatus 317 may include mechanical actuators that are coupled to the control system 150 and are configured to move the mechanical shutters 319-1 to 319-N based on commands from the control system 150.

In implementations in which the beam control apparatus 317 is optical, each shutter 319-1 to 319-N may be, for example, a Pockels cell that allows the respective light beam 316-1 to 316-N to exit the discharge chamber 315-1 to 315-N only when a voltage that is greater than a threshold voltage is applied. In these implementations, the beam control apparatus 317 also includes various associated components for operating the shutters 319-1 to 319-N. For example, the beam control apparatus 317 may include one or more voltage supplies and associated electronics that are coupled to the control system 150 and are configured to change the state of the optical shutters 319-1 to 319-N.

Moreover, in some implementations, each shutter 319-1 to 319-N may include or may be an optical sensor. In these implementations, each shutter 319-1 to 319-N is capable of sensing light that propagates in the respective optical oscillator 312-1 to 312-N. In these implementations, the shutters 319-1 to 319-N provide information related to the sensed light (for example, data that represents measurements of energy and/or power) to the control system 350.

Figure 4:
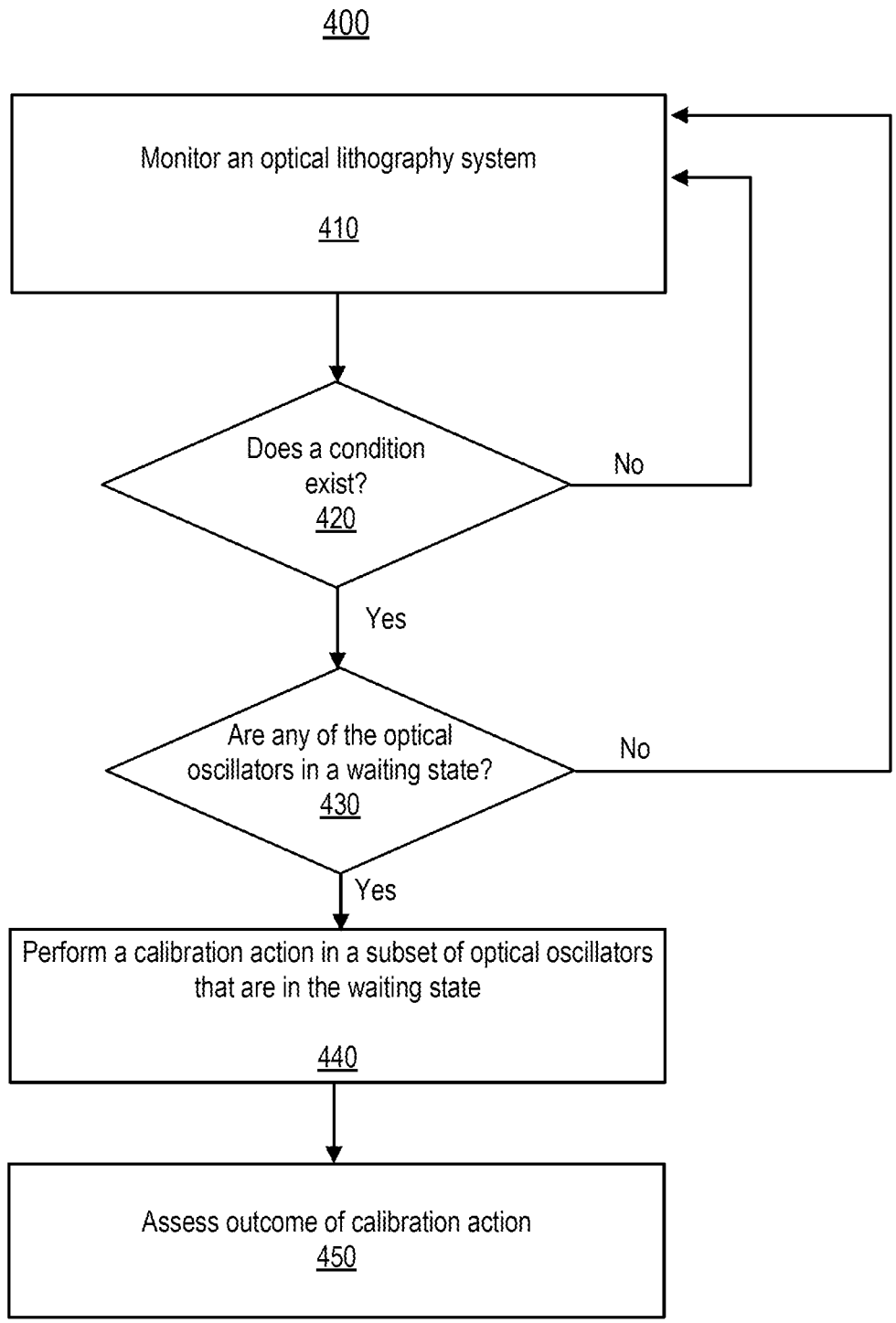
FIG. 4 is a flow chart of an example of a process for performing an in-production calibration action in an optical lithography system.

FIG. 4 is a flow chart of a process 400. The process 400 is an example process for performing an in-production calibration action in an optical lithography system. An in-production calibration is a calibration action that is performed while the optical lithography system exposes wafers. The process 400 may be performed by the control system 150. For example, the process 400 may be implemented as a collection of instructions (for example, a computer program or computer software) that are stored on the electronic storage 152 and performed by one or more electronic processors in the electronic processing module 151. The process 400 is discussed with respect to the optical lithography system 200 of FIG. 2 and the optical source system 310 of FIG. 3. However, the process 400 may be performed with other optical lithography systems.

The optical lithography system 200 is monitored for the occurrence or presence of a condition (410). The condition may be a time-based condition. For example, a schedule of calibration actions may be stored on the electronic storage 152 in a look-up table or database. The look-up table or database stores time periods in association with one or more calibration actions. For example, the look-up table or database may store a schedule of refill operations that indicates that each gain medium 214-1 to 214-N must be replaced at least once a month. In this example, the control system 150 monitors an amount of time elapsed since the most refill operation for each optical oscillator 212-1 to 212-N and declares that a condition exits in a particular one of the optical oscillators 212-1 to 212-N when the amount of time since the most recent refill operation for that optical oscillator is equal to the time specified by the schedule.

In another example, the control system 150 monitors the optical lithography system 200 by monitoring for the occurrence of an event. An example of an event is a receipt of a command signal from the metrology system 270 of the scanner apparatus 280. The command signal indicates that an event has occurred or will soon occur in the scanner apparatus 280. For example, the command signal may indicate that the scanner apparatus 280 will soon switch to a different operating mode, such as an operating mode that requires more optical energy or a greater dose, or a multi-focal imaging (MFI) operating mode in which the shaped exposure beam 211' includes light beams of different wavelengths. In other examples, the command signal indicates that the scanner apparatus 280 will soon switch to an application that requires a different repetition rate of the exposure beam 211. If the command signal from the metrology system 270 relates to an event that has not yet occurred, the command signal includes an indication of an amount of time until the event occurs.

The control system 150 determines if one or more conditions exist (420). A condition is determined to exist based on an event-based condition existing (for example, receipt of a command signal from the metrology system 270 of the scanner apparatus 280) or on a time-based condition existing (for example, by determining that a pre-determined amount of time has elapsed). If a condition exists, the control system 150 determines whether any of the optical oscillators 212-1 to 212-N are in a waiting state (430). An optical oscillator is in the waiting state when the light beam produced by that optical oscillator is not contributing significantly to the exposure beam 211. For example, an optical oscillator is in the waiting state when the light beam produces by that optical oscillator is not incident on the beam combiner 218. An optical oscillator is in the waiting state, for example, when the beam control apparatus 217 prevents the light beam produced by that optical oscillator from reaching the beam combiner. For example, and referring also to FIG. 3, the optical oscillator 312-1 is in the waiting state when the shutter 319-1 is in the second state. On the other hand, the optical oscillator 312-1 is in a ready state when the shutter 319-1 is in the first state and the optical oscillator 312-1 provides the light beam 316-1 to the beam combiner 318. In another example, an optical oscillator is in the waiting state when the optical oscillator is offline or is not producing a light beam at all. In yet another example, an optical oscillator is in the waiting state when a trace or very small amount of light from the optical oscillator reaches the beam combiner 218. For example, a trace or very small amount of light may be less than 1% or less than 0.1% of the amount of light that the optical oscillator would typically provide and the trace or very small amount of light does not significantly contribute to the dose provided to the wafer 282.

The control system 150 may determine whether or not a particular one of the optical oscillators 212-1 to 212-N is in the waiting state by determining the state or configuration of the beam control apparatus 217. For example, the control system 150 may determine the state of a shutter associated with each of the optical oscillators 212-1 to 212-N. In the example of FIG. 4, if none of the optical oscillators 212-1 to 212-N are in the waiting state, the process 400 returns to (410) to continue to monitor the optical lithography system 200. Other implementations are possible. For example, the process 400 may end if none of the optical oscillators 212-1 to 212-N are in the waiting state. In some implementations, if none of the optical oscillators 212-1 to 212-N are in the waiting state, the control system 150 places at least one of the optical oscillators 212-1 to 212-N in the waiting state by controlling the configuration of the beam control apparatus 217.

If a subset of the optical oscillators 212-1 to 212-N are in the waiting state and one or more conditions exist, the control system 150 causes a calibration action or actions to occur in the subset of optical oscillators (440). The subset includes N−1 or fewer of the optical oscillators 212-1 to 212-N and the subset only includes those optical oscillators that are in the waiting state. The subset may include, for example, one optical oscillator. Because the subset includes N−1 or fewer optical oscillators, the exposure beam 211 continues to be provided to the scanner apparatus 280. Thus, the calibration action is an in-production calibration.

The calibration action is any type of action that calibrates or otherwise enhances the performance of the subset of optical oscillators. For example, if the condition exists due to the control system 150 receiving a command signal that indicates that the scanner apparatus 180 will switch to an MFI mode in several minutes, the control system 150 performs a calibration action that includes setting one or more beam parameters for an optical oscillator in the subset. The beam parameters may include, for example, beam quality, energy, bandwidth, and/or center wavelength.

To provide a more specific example, the optical oscillator 212-1 is part of the subset and is in the waiting state. The control system 150 commands the optical oscillator 212-1 to begin forming pulses (while still in the waiting state), and the control system 150 receives data from the optical oscillator 212-1 and determines the properties of the light beam 216-1 based on the data. The data may be received from, for example, the line center analysis module 298-1. The control system 150 continues to monitor the properties of the light beam 216-1 prior to the switch to the MFI mode and during the period specified by the command signal.

Moreover, different calibration actions may be performed in the individual optical oscillators in the subset. For example, the optical oscillators 210-1 and 210-2 (not shown, but one of the N optical oscillators of the optical source system 210) may be included in the subset. The control system 350 may cause a calibration action that brings the wavelength of the light beam 216-1 produced by the optical oscillator 210-1 to be within a target wavelength band. Concurrently or nearly concurrently, the control system 350 may cause a calibration action that brings the pulse energy of a light beam 216-2 (not shown) produced by the optical oscillator 210-2 to be within a target energy band.

In another example, the condition exists due to receiving a command signal from the metrology system 270 indicating that the scanner apparatus 280 will switch to a higher dose application in a few minutes. Any optical oscillators 212-1 to 212-N that are in the off or waiting mode are activated and a calibration action, such as a warm up procedure, is performed such that the properties of the light beam produced by the activated oscillators is within specification. By activating an additional oscillator or oscillators, the control system 150 causes more energy and thus a higher dose to be delivered to the wafer 282. Performing the warm up procedure ensures that the newly activated optical oscillator performs within specification before contributing to the exposure beam 211.

When an optical oscillator is activated after an extended period of inactivity, it is possible for the optical oscillator to have an unusually low energy efficiency when reactivated (for example, when voltage is applied to the electrodes after an extended period of no voltages being applied). Thus, the initial pulses of light produced by a newly activated optical oscillator may have, for example, less than a typical amount of energy even though more than a typical amount of voltage is applied to the electrodes. These lower-energy pulses may negatively impact automatic control algorithms and/or the exposure beam 211. By performing the warm up procedure while the optical oscillator is in the waiting state, the control system 150 ensures that the light beam emitted from a newly activated laser does not contribute to the exposure beam 211 until the emitted light beam is within specification. Thus, the warm up procedure improves the performance of the scanner apparatus 280.

In some implementations, the electronic storage 152 stores instructions for a plurality of possible event-based conditions in association with one or more calibration actions that are performed when that event-based condition exists. Each calibration action is a collection of instructions (for example, a computer program or computer software) that, when, executed by the electronic processing module 151, cause components in the optical source system 110 and/or the scanner apparatus 280 to perform specific actions. For example, the instructions may cause the electronic processing module 151 to generate commands for one or more of the line narrowing modules 295-1 to 295-N, the gas supply system 290, and/or one or more of the optical oscillators 210-1 to 210-N.

In another example, the condition is a time-based condition that exists due to a pre-determined amount of time elapsing. For example, the control system 150 may determine that a scheduled refill is due for the optical oscillator 212-1 because a threshold amount of time has passed since the most recent refill procedure. In this example, the control system 150 issues a command signal to the optical oscillator 212-1 to enter an off state in which the electrodes 213-1a and 213-1b are not energized. The control system 150 also commands the optical oscillator 212-1 to vent the gaseous gain medium 214-1. After the gas medium 214-1 has been vented or otherwise removed from the discharge chamber 215-1, the control system 150 commands the gas supply system 290 to fill the discharge chamber 215-1 with gas from the chamber 291. While the refill procedure occurs, the other N−1 optical oscillators continue to produce light beams that are incident on the beam combiner 218. In this way, the gain medium 214-1 in the discharge chamber 215-1 is removed and replaced while the exposure beam 211 continues to be produced.

The success of the calibration action is assessed (450). For example, if the calibration action is successful, the properties of the light beam produced by the optical oscillator in which the calibration action was performed are within specification for the operating mode of the scanner apparatus 280. Thus, in some implementations, measured properties of the light beam are compared to the specification to determine if the calibration action is successful. The properties of the light beam may be determined from measurements obtained by the line center analysis module 298-1. In another example, the calibration action is a warm up procedure. In these implementations, the control system 150 monitors the amount of voltage applied to the electrodes and/or the energy of the produced light beam while the optical oscillator is in the waiting state or after the warm up procedure ends to determine whether the warm up procedure is successful.

In some implementations, if the calibration action is successful, the process 400 returns to (410) and the monitoring of the optical lithography system 200 continues. In some implementations, if the calibration action is not successful, the process 400 returns to (440) and the calibration action is performed again. For example, in the example of the scanner apparatus 280 transitioning to the MFI mode and the calibration action occurring in the optical oscillator 210-1, if the properties of the light beam 216-1 (such as beam quality, wavelength, and/or pulse energy) are not within specification before the time period specified in the command signal, the control system 150 sends a command signal to the metrology system 270 of the scanner apparatus 280 to delay the transition to the WI mode to allow more time for the properties of the light beam 216-1 to reach specification. In the example of the refill operation of the discharge chamber 215-1, if the refill is not successfully completed, the control system 150 may send a command signal to the metrology system of the scanner apparatus 280 such that the scanner apparatus 280 does not enter into a mode that requires the light beam 216-1.

In some implementations, the process 400 ends or returns to (410) even if the calibration action is unsuccessful. For example, equipment failure or an unrecoverable error causes the calibration action to be unsuccessful, the control system 150 takes places the optical oscillator in which the calibration action was performed in the off state and informs the scanner apparatus 280 that the optical oscillator in which the calibration action was performed is unavailable.

The optical oscillator in which the calibration action is performed may produce an acceptable light beam even if the calibration action is unsuccessful. In some implementations, a clock or timer in the control system 150 is started when the calibration action is initiated, and the calibration action ends if the criteria or criterion for a successful calibration action are not achieved within a pre-defined period of time. For example, in these implementations, the electronic storage 152 stores a time period in association with at least some of the calibration actions. Each time period is the pre-defined period of time that the calibration action will be performed before ending if the success criteria or criterion are not met. Even if the calibration action ends without the success criteria or criterion being met, the exposure beam 211 may be acceptable for use. For example, the calibration action may relate to a non-critical property of the exposure beam 211 that is not required for the exposure beam 211 to be acceptable for use.

Figure 5:
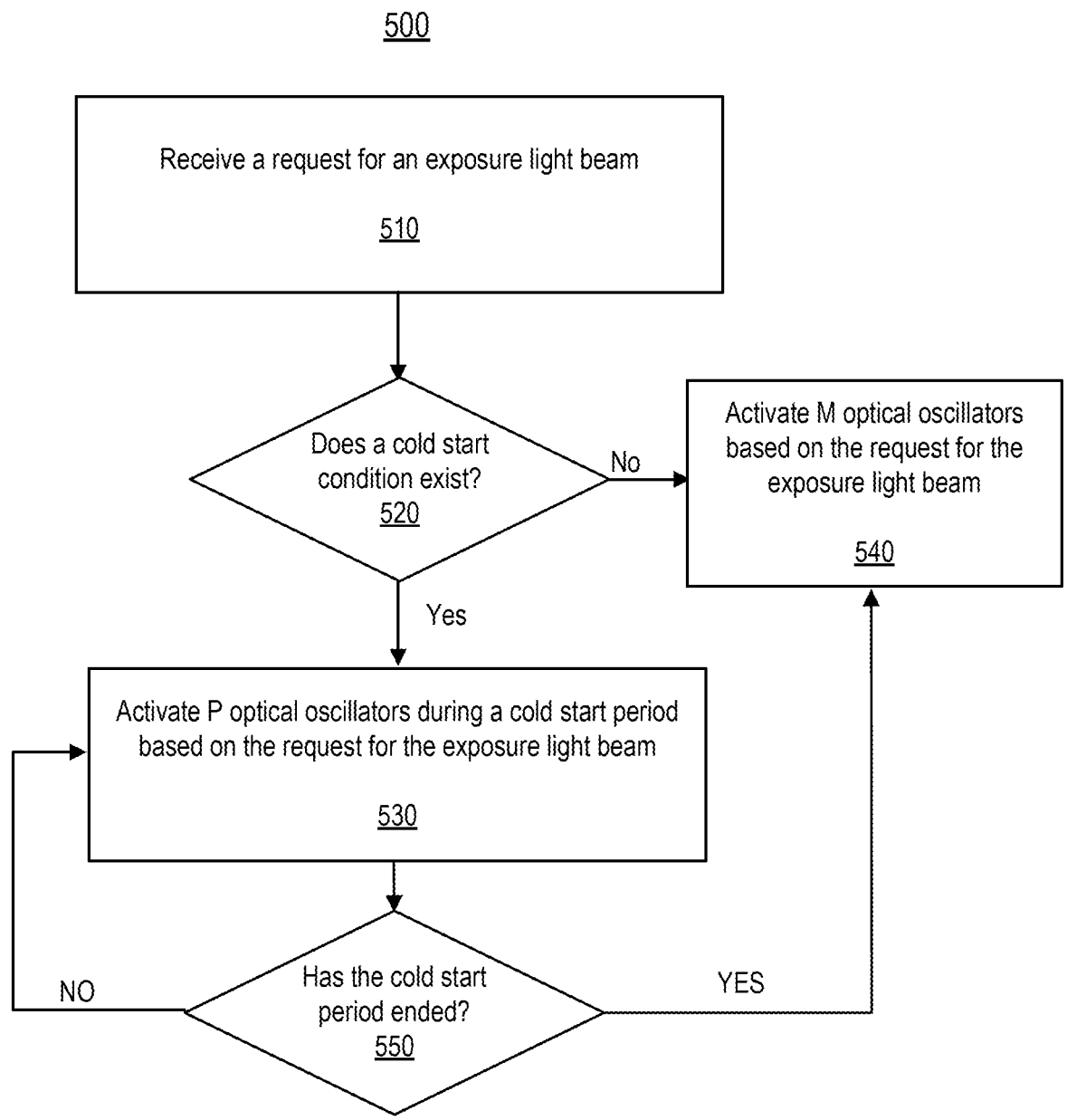
FIG. 5 is a flow chart of an example of a process for producing an exposure beam during a cold start period in an optical lithography system.

FIG. 5 is a flowchart of a process 500. The process 500 is an example process for producing an exposure beam during a cold start period in an optical lithography system. The process 500 may be performed by the control system 150. For example, the process 500 may be implemented as a collection of instructions (for example, a computer program or computer software) that are stored on the electronic storage 152 and performed by one or more electronic processors in the electronic processing module 151. The process 500 is discussed with respect to the optical lithography system 200 of FIG. 2 and the optical source system 310 of FIG. 3. However, the process 500 may be performed with other optical lithography systems.

If any of the optical oscillators 212-1 to 212-N have not been activated for an extended and continuous amount of time or have never been activated, that optical oscillator is considered to be in a cold start condition. The optical oscillators 212-1 to 212-N are activated by applying voltage to the electrodes that excite the respective gain medium in each of the oscillators 212-1 to 212-N. When an optical oscillator that is in a cold start condition is activated, the optical oscillator has an abnormally low energy efficiency during a cold start period. The low energy efficiency results in a greater amount of energy (or voltage) being required to produce the expected properties of the respective light beams 216-1 to 216-N. As a result, during the cold start period, the light-beams 216-1 to 216-N may have a lower pulse energy than expected and/or may exhibit transient effects, such as unusual temporal variations in pulse energy. These effects are generally temporary and resolve when the optical oscillators 212-1 to 212-N reach steady-state operation. The time between the initial activation after the idle time and steady-state operation is the cold start period. The duration of the cold start period depends on one or more conditions related to the optical oscillators 212-1 to 212-N. The one or more conditions include, for example, the amount of time that the oscillators 212-1 to 212-N have been idle and/or the age of the optical oscillators 212-1 to 212-N. The process 500 allows an acceptable exposure beam 211 to be produced during the cold start period.

The optical source system 210 receives a request for the exposure light beam 211 (510). The request may be, for example, a command signal from the metrology system 270 of the scanner apparatus 280. In another example, the request may be a command signal generated based on operator input received at the I/O interface 273. The request for the exposure light beam 211 includes an indication of a requested dose. The dose provided by the optical source system 210 depends in part on how many of the N optical oscillators 212-1 to 212-N are contributing to the exposure light beam 211.

Whether or not a cold start condition exists is determined (520). A cold start condition exists in the optical source system 210 if the number (m) of optical oscillators that are operating under steady-state and typical conditions (thus, not in a cold start condition) is less than the nominal number (M) of optical oscillators needed to produce the requested dose, where m is an integer number that is less than M, and M is an integer number that is less than N. The M optical oscillators is the nominal number of optical oscillators that are activated under ordinary, steady-state conditions to produce an exposure beam having a particular dose. A look up table or database may store the nominal number of optical oscillators (M) associated with each of a plurality of possible doses.

A cold start condition exists in the optical source system 210 if all of the N optical oscillators 212-1 to 212-N have been inactive for an extended period of time. Moreover, a cold start condition exists in the optical source system 210 if the N optical oscillators 212-1 to 212-N do not include a group of M optical oscillators 212-1 to 212-N that are not in a cold start condition. That is, a cold start condition exists in the optical source system 210 if m is less than M (the number of optical oscillators that are not in a cold start condition is less than the nominal number of optical oscillators needed to produce the requested dose).

Whether or not a cold start condition exists in the optical source system 210 may be determined by assessing whether m is less than M. To determine which (if any) of the optical oscillators 212-1 to 212-N are in a cold start condition, the control system 150 may determine whether or not the voltage source 297 is applying voltage signals to the electrodes in the electrodes of the various optical oscillators 212-1 to 212-N. If the voltage source 297 is not applying voltage signals to the electrodes of a particular one of the optical oscillators 212-1 to 212-N, then the amount of time since the voltage source 297 applied a voltage signal to the electrodes is determined to determine how long that optical oscillator has been idle. The amount of time that has elapsed since the most recent activation is called the idle time. The idle time is compared to a cold start threshold stored on the electronic storage 152. The cold start threshold may vary with chamber age and/or the chamber type. The cold start threshold may be stored in a look-up table or database that associates various cold start threshold times with various conditions. If the amount of idle time exceeds the cold start threshold, then a cold start condition exists in that optical oscillator. Each of the optical oscillators 212-1 to 212-N may be assessed to determine if a cold start condition exists in that optical oscillator.

In some implementations, the operator of the lithography system 200 enters an indication of a cold start condition into the I/O interface 153, and the existence of the cold start condition in one of more of the optical oscillators 210-1 to 210-N is determined based on the indication.

In the example of the process 500, under ordinary steady-state operating conditions, the requested dose is achieved by combining M of the light beams 216-1 to 216-N, where M is an integer number that is less than N. In other words, the requested dose is such that fewer than all N light beams 216-1 to 216-N are needed under ordinary, steady-state operating conditions. If a cold start condition does not exist in the optical source system 210, then M of the optical oscillators 212-1 to 212-N are activated (540).

However, if a cold start condition exists (in is less than M), the control system 150 activates P of the optical oscillators 212-1 to 212-N that have a cold start condition (530). The relationship between P, M, N, and in is provided by Equation 1:

$$M-m < P \leq N-m \qquad \text{Equation (1)}.$$

Two examples are discussed to provide further details of using P optical oscillators having the cold start condition to provide all of part of the exposure beam 211 during the cold start period.

In the first example, N is ten (10) and the optical source system 210 includes optical oscillators 210-1 to 210-10; in is three (3), meaning that three of the N optical oscillators 210-1 to 210-10 are not in a cold start condition and seven (7) of the N optical oscillators 210-1 to 210-10 are in a cold start condition; and the requested dose is associated with a nominal number (M) of five (5), meaning that nominally the requested dose requires a light beam from five of the ten optical oscillators 210-1 to 210-10. Thus, in this example, the optical source system 210 includes fewer than M=5 optical oscillators that are not in a cold start condition. The number of available optical oscillators (m) is compared to the nominal number of optical oscillators (M). Because m=3 is less than M=5, a cold start condition is declared in the optical source system 210. In this example, the equivalent optical output of 2 (two) additional steady-state optical oscillators is needed to bring the dose of the exposure beam 211 to the requested dose. The deficiency in steady-state optical output is determined by M−m. In this example, M−m is two (2), thus, the equivalent output of two steady-state optical oscillators will compensate for the cold start condition.

The control system 150 activates P oscillators that have the cold start condition. Because the P oscillators have a cold start condition, they also have a lower efficiency during the cold start period. Thus, the value of P chosen by control system 150 may be greater than (M−m), rather than merely equal to (M−m). The value of P depends on the amount of inefficiency caused by the cold start condition. For example, the efficiency of the optical oscillators 212-1 to 212-N may be known to drop by 50% during the cold start period. In this example in which the efficiency drops by 50% during the cold start period and the equivalent of the optical output of two optical oscillators needs to be provided, P is four (4), which is twice the difference between the available optical oscillators (m) and the nominal number of optical oscillators (M). P is 2*(M−m) in this example because the efficiency is known to drop by 50% during the cold start period. Other examples may have more or less of a drop in efficiency during the cold start period. Regardless, by activating P optical oscillators that have the cold start condition during the cold start period (in addition to the m optical oscillators that do not have a cold start condition), the control system 150 ensures that the exposure beam 211 provides the requested dose during the cold start period.

In another example, N is two (2), and the optical source system 210 includes optical oscillators 212-1 and 212-2. In this example, both of the optical oscillators 212-1 and 212-2 are in the cold start condition. Thus, in this example, in is zero (0). The requested dose is a dose that one of the optical oscillators 210-1 or 210-2 is able to provide during typical steady-state operating conditions. Thus, M is one (1) in this example. M is greater than m, and, accordingly, a cold start condition exists in the optical source system 210. To compensate for the temporary effects of the cold start condition, the control system 150 commands the voltage source 297 to apply a train of voltage pulses to the electrodes in the optical oscillators 210-1 and 212-2, and the beam control apparatus 217 is set such that both of the resulting light beams 216-1 and 216-2 to reach the beam combiner 218 and contribute to the exposure beam 211. In other words, the control system 150 compensates for the transient effects of the cold start condition by using both of the light beams 216-1 and 216-2 during the cold start period. In this example, the command signal from the metrology system 270 of the scanner apparatus 280 triggers the control system 150 to cause both of the optical oscillators 212-1 and 212-2 to produce light beams during the cold start period.

Whether or not the cold start period has ended is determined (550). The cold start period may be determined to have ended after the properties of the light beam produced by each of the P activated optical oscillators are within steady-state specifications and/or when an amount of voltage applied by the voltage source 297 is within steady-state specifications. The steady-state specifications may be stored on the electronic storage 152. In some implementations, the cold start period is pre-defined and stored on the electronic storage 152. In these implementations, the cold start period is determined to have ended when more than the pre-determined amount of time has passed. If the cold start period has not ended, the control system 150 continues to activate the m+P optical oscillators (530).

After the cold start period ends, the process 500 returns to (540) and continues to produce the exposure beam 211 under ordinary steady state conditions. Some of the P optical oscillators may no longer be needed and thus may be deactivated, so that the exposure beam 211 is generated from M optical oscillators.

Other aspects of the invention are set out in the following numbered clauses.

1. A deep ultraviolet (DUV) optical system comprising:
   an optical source system comprising:
   a plurality of optical oscillators;
   a beam combiner; and
   a beam control apparatus between the optical oscillators and the beam combiner, wherein the beam combiner is configured to receive and direct light emitted from any of the optical oscillators toward a scanner apparatus as an exposure light beam, and the beam control apparatus is configured to determine whether the beam combiner receives light from a particular one of the plurality of optical oscillators; and
   a control system coupled to the optical source system, the control system configured to:
   determine whether a condition exists in the DUV optical system; and
   based on a determination that the condition exists, perform a calibration action in a subset of the optical oscillators.

2. The DUV optical system of clause 1, wherein the calibration action comprises bringing a wavelength of light produced by at least one of the optical oscillators to be within a target range.

3. The DUV optical system of clause 1, wherein the calibration action comprises bringing a bandwidth of light produced by at least one of the optical oscillators to be within a target range.

4. The DUV optical system of clause 1, wherein the calibration action comprises bringing a pulse energy of light produced by at least one of the optical oscillators to be within a target range.

5. The DUV optical system of clause 1 wherein the condition is a time-based condition or an event-based condition.

6. The DUV optical system of clause 5, wherein the condition is an event-based condition, the control system is coupled to the light source system and the scanner apparatus, the control system is configured to receive a status signal from the DUV optical system, and the control system determines whether the event-based condition exists based on the status signal from the scanner apparatus.

7. The DUV optical system of clause 6, wherein the status signal comprises information related to an upcoming event in the scanner apparatus, and the control system performs the calibration action based on the information related to the upcoming event.

8. The DUV optical system of clause 7, wherein the information related to the upcoming event comprises an amount of time until the upcoming event occurs and an indication that identifies the upcoming event, and the control system performs the calibration action before the upcoming event occurs.

9. The DUV optical system of clause 8, wherein the upcoming event comprises a change in an operating condition of the scanner apparatus, the change in the operating condition comprising a change in a repetition rate of the exposure beam, a change in a power of the exposure beam, or a change in operating mode of the scanner apparatus.

10. The DUV optical system of clause 8, wherein the calibration action performed is one of a plurality of available calibration actions, and the calibration action performed is determined from the plurality of available calibration actions based on the indication that identifies the upcoming event.

11. The DUV optical system of clause 5, wherein the condition is a time-based condition, the control system is configured to monitor a status of the DUV optical system, and the control system is configured to determine the condition of the DUV optical system based on the monitored status of the optical source system.

12. The DUV optical system of clause 11, wherein the control system being configured to monitor the status of the DUV optical system comprises the control system being configured to monitor an amount of time that has passed since a starting time, and the control system determines the condition of the DUV optical system based on the amount of time that has passed since the starting time.

13. The DUV optical system of clause 12, wherein the starting time comprises a time at which an immediately preceding calibration event occurred.

14. The DUV optical system of clause 13, wherein, to determine the condition of the DUV optical system, the control system is further configured to compare the amount of time that has passed to a specification, and, the control system is configured to perform the calibration action if the amount of time that has passed meets the specification.

15. The DUV optical system of clause 1, wherein each optical oscillator comprises a gain medium, the gain medium comprises a gaseous gain medium, the calibration action comprises a refill operation, and the refill operation comprises exchanging the gaseous gain medium in a subset of the optical oscillators.

16. The DUV optical system of clause 1, wherein the beam control apparatus comprises a beam blocking device for each of the plurality of optical oscillators, and each of the beam blocking devices is coupled to the control system; and
the control system is further configured to control the beam blocking devices to determine whether the beam combiner receives light from a particular one of the optical oscillators.

17. The DUV optical system of clause 16, wherein each beam blocking device is a shutter comprising a first state that transmits DUV light and a second state that blocks MTV light, and each shutter is configured for placement at the output of one of the optical oscillators such that each shutter prevents a respective one of the optical oscillators from emitting light toward the beam combiner when in the second state and allows the respective one of the optical oscillators to emit light toward the beam combiner when in the first state.

18. The DUV optical system of clause 1, wherein the subset of the optical oscillators does not include any of the plurality of optical oscillators that are producing a light beam that is part of the exposure beam.

19. The DUV optical system of clause 1, wherein the calibration action is only performed if the beam combiner does not receive light from the subset of the optical oscillators.

20. The DUV optical system of clause 1, wherein the DUV optical system is configured for use in a DUV optical lithography system.

21. The DUV optical system of clause 20, further comprising a scanner apparatus configured to receive an exposure beam from the beam combiner.

22. A method of controlling a plurality of optical oscillators in a deep ultraviolet (DUV) optical system, the method comprising:
monitoring the DUV optical system to determine if a condition exists;
if a condition exists, determining if any of the plurality of optical oscillators are in a waiting state; and
performing a calibration action in a subset of the plurality of optical oscillators that are in the waiting state, wherein one or more of the optical oscillators that are not in the waiting state continue to produce an exposure beam while the calibration action is performed.

23. The method of clause 22, further comprising, determining whether the calibration action was successful.

24. The method of clause 22, wherein the DUV optical system is configured for use with a DUV optical lithography system, and monitoring the DUV optical system comprises receiving a command signal from a scanner apparatus and determining whether the condition exists based on the command signal.

25. The method of clause 22, wherein, if the condition exists and none of the plurality of optical oscillators are in the waiting state, placing at least one optical oscillator in the waiting state.

26. An optical lithography system comprising:
a deep ultraviolet (DUV) optical lithography system comprising:
an optical source system comprising:
a plurality of optical oscillators, each comprising a gain medium;
a beam combiner; and
a beam control apparatus between the gain media and the beam combiner, wherein the beam combiner is configured to receive and direct light emitted from any of the optical oscillators toward a scanner apparatus as an exposure light beam, and the beam control apparatus is configured to determine whether the beam combiner receives light from a particular one of the optical oscillators;
a scanner apparatus; and
a control system coupled to the optical source system and the scanner apparatus, the control system configured to:
determine whether a condition exists in the optical lithography system, and
if a condition is determined to exist, perform a calibration action in a subset of the optical oscillators.

27. The optical lithography system of clause 26, further comprising a gas supply system fluidly coupled to the plurality of optical oscillators.

28. A method of controlling a plurality of optical oscillators in a deep ultraviolet (DUV) optical lithography system, the method comprising:
receiving a request for an exposure beam configured to provide a requested dose of DUV light to a wafer;
determining if a cold start condition exists; and
if the cold start condition exists:
activating more than a nominal number of optical oscillators, the nominal number of optical oscillators being a number of optical oscillators capable of providing the requested dose under steady-state conditions; and
directing a light beam from each of the activated optical oscillators toward a scanner apparatus to provide the exposure beam during a cold start period.

29. The method of clause 28, wherein, if the cold start condition exists, further comprising:
determining whether the cold start period has ended; and
if the cold start period has ended, deactivating at least one of the activated optical oscillators.

30. A control system comprising:
an interface configured to communicate with a DUV optical system, and wherein the control system is configured to control the DUV optical system by:
determining whether a condition exists in the DUV optical system, and
based on a determination that the condition exists, performing a calibration action in a subset of optical oscillators in the DUV optical system while at least one optical oscillator that is not in the subset of optical oscillators produces an exposure beam.

31. The control system of clause 30, further comprising:
one or more electronic processors; and
a computer-readable electronic storage coupled to the one or more electronic processors, the computer-readable electronic storage comprising executable instructions that, when executed, cause the control system to communicate with the DUV optical system via the interface.

32. An optical source system comprising:
  N optical oscillators, wherein N is an integer number that is greater than or equal to two;
  a beam combiner configured to produce an exposure beam from one or more light beams received from one or more of the N optical oscillators; and
  a control system configured to control the plurality of optical oscillators to determine which M of the plurality of optical oscillators produce light for the exposure beam, wherein M is an integer that is greater than or equal to one and is less than or equal to N.

33. The optical source system of clause 32, wherein the control system is further configured to:
  determine whether a condition exists in the optical source system, and to perform a calibration action in one or more of the plurality of optical oscillators if the condition exists, and wherein
  the calibration action adjusts a property of a light beam emitted by the one of the plurality of optical oscillators, and the property comprises a center wavelength, an energy, or a spectral bandwidth.

34. The optical source system of clause 33, wherein the calibration action is performed only when the one or more of the optical oscillators in which the condition exists are not producing light.

35. The optical source system of clause 34, wherein each of the plurality of optical oscillators comprises an excimer laser.

36. The optical source system of clause 32, wherein the beam combiner is between the plurality of optical oscillators and a scanner configured to expose a semiconductor wafer.

37. The optical source system of clause 32, wherein the optical oscillators produces light beams having different center wavelengths.

Other implementations are within the scope of the claims.

What is claimed is:

1. A deep ultraviolet (DUV) optical system comprising:
  an optical source system comprising:
  a plurality of optical oscillators;
  a beam combiner; and
  a beam control apparatus between the optical oscillators and the beam combiner, wherein the beam combiner is configured to receive and direct light emitted from any of the optical oscillators toward a scanner apparatus as an exposure light beam, and the beam control apparatus is configured to determine whether the beam combiner receives light from a particular one of the plurality of optical oscillators; and
  a control system coupled to the optical source system, the control system configured to:
  determine whether a condition exists in the DUV optical system; and
  based on a determination that the condition exists, perform a calibration action in a subset of the optical oscillators.

2. The DUV optical system of claim 1, wherein the calibration action comprises bringing a wavelength of light produced by at least one of the optical oscillators to be within a target range.

3. The DUV optical system of claim 1, wherein the condition is a time-based condition or an event-based condition.

4. The DUV optical system of claim 3, wherein the condition is an event-based condition, the control system is coupled to the light source system and the scanner apparatus, the control system is configured to receive a status signal from the DUV optical system, and the control system determines whether the event-based condition exists based on the status signal from the scanner apparatus.

5. The DUV optical system of claim 4, wherein the status signal comprises information related to an upcoming event in the scanner apparatus, and the control system performs the calibration action based on the information related to the upcoming event.

6. The DUV optical system of claim 5, wherein the information related to the upcoming event comprises an amount of time until the upcoming event occurs and an indication that identifies the upcoming event, and the control system performs the calibration action before the upcoming event occurs.

7. The DUV optical system of claim 6, wherein the upcoming event comprises a change in an operating condition of the scanner apparatus, the change in the operating condition comprising a change in a repetition rate of the exposure beam, a change in a power of the exposure beam, or a change in operating mode of the scanner apparatus.

8. The DUV optical system of claim 3, wherein the condition is a time-based condition, the control system is configured to monitor a status of the DUV optical system, and the control system is configured to determine the condition of the DUV optical system based on the monitored status of the optical source system.

9. The DUV optical system of claim 1, wherein each optical oscillator comprises a gain medium, the gain medium comprises a gaseous gain medium, the calibration action comprises a refill operation, and the refill operation comprises exchanging the gaseous gain medium in a subset of the optical oscillators.

10. The DUV optical system of claim 1, wherein the beam control apparatus comprises a beam blocking device for each of the plurality of optical oscillators, and each of the beam blocking devices is coupled to the control system; and
  the control system is further configured to control the beam blocking devices to determine whether the beam combiner receives light from a particular one of the optical oscillators.

11. A method of controlling a plurality of optical oscillators in a deep ultraviolet (DUV) optical system, the DUV optical system including a control system, the method comprising:
  a step performed by the control system of monitoring the DUV optical system and making a condition determination whether a condition exists;
  a step performed by the control system of determining if any of the plurality of optical oscillators are in a waiting state based at least in part on the condition determination; and
  a step performed by the control system of performing a calibration action in a subset of the plurality of optical oscillators that are in the waiting state, wherein one or more of the optical oscillators that are not in the waiting state continue to produce an exposure beam while the control system performs the calibration action.

12. The method of claim 11, wherein the DUV optical system is configured for use with a DUV optical lithography system, and monitoring the DUV optical system comprises receiving a command signal from a scanner apparatus and determining whether the condition exists based on the command signal.

13. The method of claim 11, wherein, if the condition exists and none of the plurality of optical oscillators are in the waiting state, placing at least one optical oscillator in the waiting state.

14. A method of controlling a plurality of optical oscillators in a deep ultraviolet (DUV) optical lithography system, the DUV optical system including a control system, the method comprising:
- a step performed by the control system of receiving a request for an exposure beam configured to provide a requested dose of DUV light to a wafer;
- a step performed by the control system of making a cold start determination of whether a cold start condition exists; and
- a step performed by the control system based at least in part on the cold start determination of:
- activating more than a nominal number of optical oscillators, the nominal number of optical oscillators being a number of optical oscillators capable of providing the requested dose under steady-state conditions; and
- directing a light beam from each of the activated optical oscillators toward a scanner apparatus to provide the exposure beam during a cold start period.

15. The method of claim 14, wherein, if the cold start condition exists, further comprising:
- determining whether the cold start period has ended; and
- if the cold start period has ended, deactivating at least one of the activated optical oscillators.

16. A control system comprising:
- an interface configured to communicate with a DUV optical system, and wherein the control system is configured to control the DUV optical system by:
- determining whether a condition exists in the DUV optical system, and
- based on a determination that the condition exists, performing a calibration action in a subset of optical oscillators in the DUV optical system while at least one optical oscillator that is not in the subset of optical oscillators produces an exposure beam.

17. An optical source system comprising:
- N optical oscillators, wherein N is an integer number that is greater than or equal to two;
- a beam combiner configured to produce an exposure beam from one or more light beams received from one or more of the N optical oscillators; and
- a control system configured to control the plurality of optical oscillators to determine which M of the plurality of optical oscillators produce light for the exposure beam, wherein M is an integer that is greater than or equal to one and is less than or equal to N,
- the control system being further configured to determine whether a condition exists in the optical source system, and to perform a calibration action in one or more of the plurality of optical oscillators if the condition exists, and
- wherein the calibration action adjusts a property of a light beam emitted by the one of the plurality of optical oscillators, and the property comprises a center wavelength, an energy, or a spectral bandwidth.

18. The optical source system of claim 17, wherein the beam combiner is between the plurality of optical oscillators and a scanner configured to expose a semiconductor wafer.

19. An optical source system comprising:
- N optical oscillators, wherein N is an integer number that is greater than or equal to two;
- a beam combiner configured to produce an exposure beam from one or more light beams received from one or more of the N optical oscillators; and
- a control system configured to control the plurality of optical oscillators to determine which M of the plurality of optical oscillators produce light for the exposure beam, wherein M is an integer that is greater than or equal to one and is less than or equal to N,
- wherein the optical oscillators produce light beams having different center wavelengths.

* * * * *